United States Patent
Corisis et al.

(10) Patent No.: US 6,414,378 B1
(45) Date of Patent: *Jul. 2, 2002

(54) HIGH SPEED IC PACKAGE CONFIGURATION

(75) Inventors: David J. Corisis, Meridian; Brent Keeth, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/472,291

(22) Filed: Dec. 27, 1999

Related U.S. Application Data

(60) Continuation of application No. 09/001,638, filed on Dec. 31, 1997, now Pat. No. 6,133,622, which is a division of application No. 08/784,362, filed on Jan. 17, 1997, now Pat. No. 6,103,547.

(51) Int. Cl.[7] ............................................. H01L 23/495
(52) U.S. Cl. ..................... 257/666; 257/678; 257/786
(58) Field of Search ................ 257/666, 676, 257/678, 786

(56) References Cited

U.S. PATENT DOCUMENTS

| | | |
|---|---|---|
| 5,147,815 A | 9/1992 | Casto |
| 5,214,845 A | 6/1993 | King et al. |
| 5,233,220 A | 8/1993 | Lamson et al. |
| 5,290,735 A | 3/1994 | Haley |
| 5,304,843 A | 4/1994 | Takubo et al. |
| 5,358,904 A | 10/1994 | Murakami et al. |
| 5,409,866 A | 4/1995 | Sato et al. |
| 5,447,888 A | 9/1995 | Takashima et al. |
| 5,480,841 A | 1/1996 | Bickford et al. |
| 5,559,306 A | 9/1996 | Mahulikar |
| 5,583,370 A | 12/1996 | Higgins, III et al. |
| 5,766,975 A | 6/1998 | Templeton, Jr. et al. |

Primary Examiner—Roy Potter
(74) Attorney, Agent, or Firm—TraskBritt

(57) ABSTRACT

Devices and methods for reducing lead inductance in integrated circuit (IC) packages. More specifically to an integrated circuit package configuration for high speed applications where the inductance of the leads is reduced or minimized in high capacity semiconductor device packages. The integrated circuit package assembly comprises a substrate, semiconductor device, insulating covering or coating, if desired, a semiconductor device retainer, lead frame, and wire bond interconnections.

33 Claims, 11 Drawing Sheets

HIGH SPEED IC PACKAGE CONFIGURATION

CROSS REFERENCE TO RELATED APPLICATION

This application is a continuation of application Ser. No. 09/001,638, filed Dec. 31, 1997, now U.S. Pat. No. 6,133,622, issued Oct. 17, 2000, which is a divisional of application Ser. No. 08/784,362, filed Jan. 17, 1997, now U.S. Pat. No. 6,103,547, issued Aug. 15, 2000.

FILED OF THE INVENTION

The present invention relates in general to devices and methods for reducing lead inductance in integrated circuit (IC) packages and, more specifically, to an integrated circuit package configuration for high speed applications where the inductance of the leads is reduced or minimized in high capacity semiconductor device packages.

STATE OF THE ART

Integrated circuit (IC) packages typically contain small, generally rectangular integrated circuits referred to as IC "dice" or "chips". These IC dice come in an almost infinite variety of forms, including, for example, Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice.

Packaged IC dice communicate with circuitry external to their packages through lead frames embedded in the packages. These lead frames generally include an assembly of leads that extend into the packages to connect to bond pads on the IC dice through thin wire bonds or other coonecting means and extend from the packages to teminate in pins or other terminals that connect to the external circuitry. Exemplary conventional lead frames include paddle-type wire-bond lead frames, which include a central die support and leads which extend to the preimeter of IC dice and connect to the dice through thin wire bonds, Leads-Over-Chip (LOC) lead frames, having leads which extend over an IC die to attach to and support the die while being electrically connected to the die through wire bonds or other connecting means, and Leads-Under-Chip (LUC) lead frames, having leads connected to the die typically through wire bonds.

As with all conductors, the leads in lead frames have an inductance associated with them that increases as the frequency of signals passing through the leads increases. This lead inductance is the result of two interactions: the interaction among magnetic fields created by signal currents flowing to and from an IC die through the leads (known as "mutual" inductance); and the interaction between the magnetic fields created by the signal currents flowing to and from the IC die through the leads and magnetic fields created by oppositely directed currents flowing to and from ground (known as "self" inductance).

While lead inductance in IC packages for memory devices has not traditionally been troublesome because traditionally slow signal frequencies have made the inductance relatively insignificant, the ever-increasing frequencies of state of the art electronic systems have made lead inductance in IC packages significant. For example, overall performance of IC dice attached to leads in IC packages is slower than desirable because the inductance associated with the leads slows changes in signal current through the leads, causing signals to take longer to propagate through the leads. Also, digital signals propagating along the leads are dispersing (i.e., "spreading out") because the so-called "Fourier" components of various frequencies that make up the digital signals propagate through the inductance associated with the leads at different speeds, causing the components, and hence the digital signals themselves, to disperse along the leads, while mild dispersion can make the digital signals unrecognizable upon receipt. Impedance mismatches between the leads and IC dice or the leads and external circuitry, caused, in part, by the inductance associated with the leads, can distort normal signals propagating along the leads at the same time as the reflection signals. Further, magnetic fields created by signal currents propagating through the inductance associated with the leads can induce currents in nearby leads, causing so-called "crosstalk" noise on the nearby leads. While these various effects can be troublesome in any electronic system, the modern trend toward 3.3 colt systems and away from 5.0 colt systems only serves to make these effects more noticeable and sugnificant. Also, the trend to ever increasing operating speeds for semiconductor devices further serves to make these effects more noticeable and significant. Particularly, such is present when the use of high density semiconductor devices operating at high frequencies requiring the use of packages having an increased number of connections to the semiconductor device is necessary.

Prior IC packages have been configured in an attempt to reduce carious effects of lead inductance as described above. For example, U.S. Pat. No. 5,214,845, assigned to the assignee of the present invention, employs a flexible, laminated sandwich assembly of an outer ground plane and an outer power plane dielectrically isolated from a series of conductive traces running therebetween. The traces and planes are connected to corresponding bond pads on an IC die at one end, and to leads on the other, as by thermocompression bonding (in case of a TAB embodiment), or by wire bonds. Such an arrangement obviously doubles the number required I/O connections by requiring ywo connections for each lead, and thus necessitates additional assembly time and increases the possibility of a faulty connection. Further, the flexible sandwich assembly constitutes an additional element of the package, increasing material cost.

Another approach to reducing the inductance effects described above is diclosed in U.S. Pat. No. 5,559,306, in which metal plates are employed above and below leads extending to the exterior of plastic and ceramic packages to effect reduction of self and mutual inductance. However, such configurations as diclosed appear to require relatively complex fabrication techniques to locate and fix the plates relative to the die and lead fingers or other conductors for subsequent transfer molding of a filled-polymer package thereabout, while the ceramic package embodiment is not cost-effective for high-volume, commercial packaging.

Accordingly, the inventors have recognized the need for a low-cost, reduced-inductance IC package configuration and readily-available materials, equipment, and fabrication techniques for semiconductor devices.

SUMMARY OF THE INVENTION

The present invention relates in general to devices and methods for reducing lead inductance in integrated circuit (IC) packages and, more specifically, to an integrated circuit package configuration for high speed applications where the inductance of the leads is reduced or minimized in high capacity semiconductor device packages. The integrated circuit package of the present invention comprises a substrate, semiconductor device, insulating covering or coating, if desired, a semiconductor device retainer, lead frame, and wire bond interconnections.

BRIEF DESCRIPTION OF THE SEVERAL VIEW OF THE DRAWINGS

The present invention will be better understood when the drawings are taken in conjunction with the specification describing the invention hereafter.

DETAILED DESCRIPTION OF THE INVENTION

Figure 1:
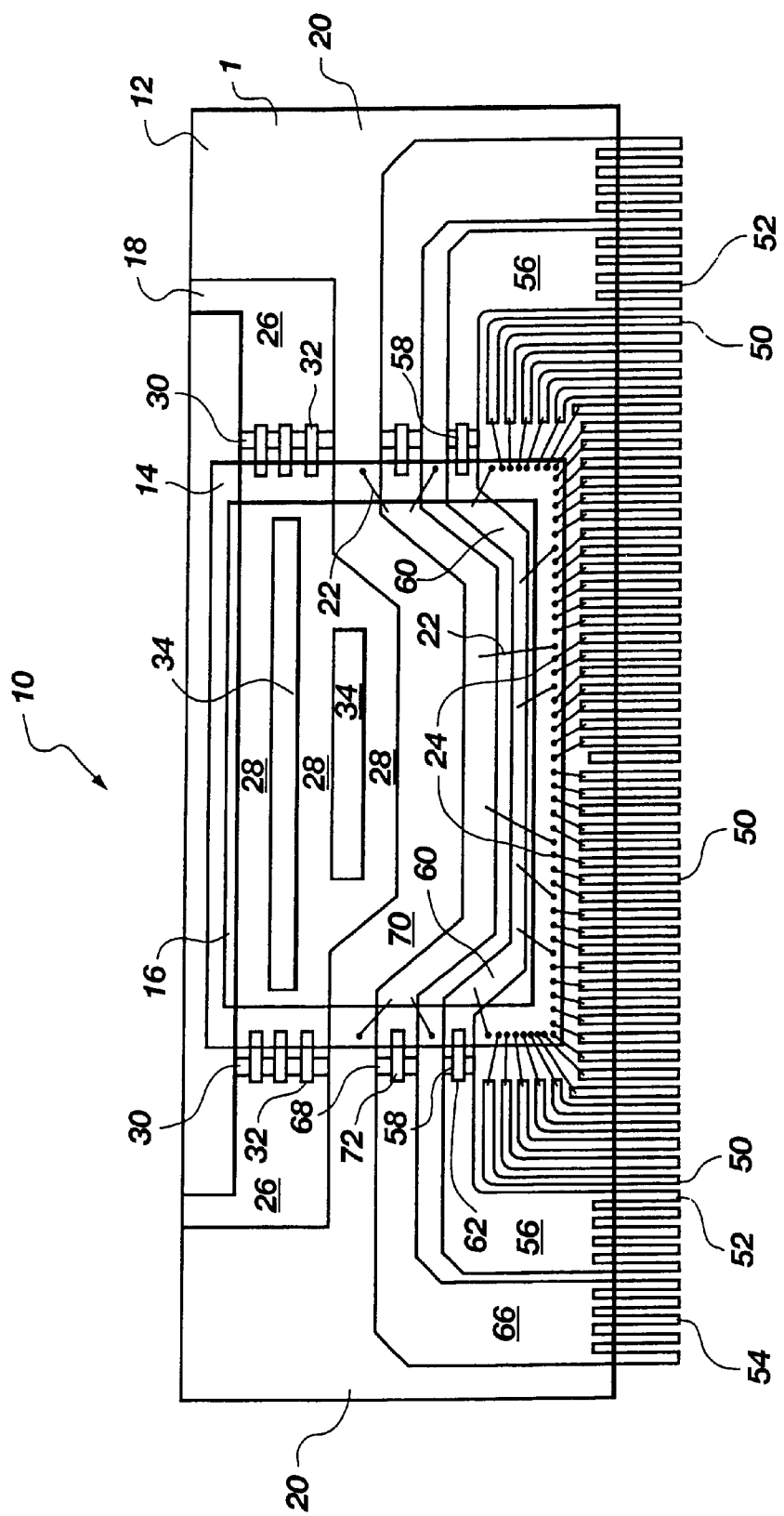
FIG. 1 is a side view of one side of a first embodiment of the present invention mounted in a vertical surface mount package.

Referring to drawing FIG. 1, the first side 1 of the integrated circuit package 10 of the present invention is shown in a vertical surface mount package configuration. The integrated circuit package 10 comprises a substrate 12, semiconductor device 14, insulating tape material 16, semiconductor device retainer 18, lead frame 20, and wire bond interconnections 22. As illustrated, the semiconductor device 14 is modified Leads-Over-Chip (LOC) configuration with respect to the lead frame 20.

The substrate 12 comprises any suitable well known substrate for use with the semiconductor device 14. The semiconductor device 14 may be secured to the first side of the substrate 12 by any suitable means, such as adhesive attachement, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The seimconductor device 14 includes at least one or a plurality of bond pads 24 (see FIG. 1) on the active surface thereof.

The insulating tape material 16 comprises any suitable well known type insulating tape which amy be adhesively coated to secure portions of the lead frame 20 thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transistion portion 30 between the first portion 26 and secone raised portion 28, one or more slotted openings 32 are included in the semiconductor device retainer 18. If desired, other openings 34 may be included in the second raised portion 28 to aid in the forming thereof. Further, if desired, the second raised portion 28 of the semiconductor retainer device 18 may be adhesively attached to the insulating tape 16 through the use of well known suitable adhesives.

The lead frame 20 comprises a first plurality of leads 50, a second plurality of leads 52 commonly connected over a portion of the length thereof, and a third plurality of leads 54 commonly connected over a portion thereof. As illustrated, the leads of the second plurality of leads 52 are commonly connected, forming a unitary lead including a first portion 56 generally contacting the substrate 12, second transition portion 58 having, in turn, slotted opening 62 therein, and third semiconductor device portion 60. The third semiconductor device portion 60 of the second plurality of leads 52 is insulated from electrical contact with the active surface of the semiconductor device 14 by the insulating tape 16. As illustrated, the leads of the third plurality of leads 54 are commonly connected, forming a unitary lead including a first portion 66 generally contacting the surface of the substrate 12, a second transistion portion 68 having slotted opeing 72 therein, and third semiconductor device portion 70. The third semiconductor device portion 70 is insulated from the active surface of the semiconductor device 14 by the insulating tape 16. The transition portions 58 and 68 of the second plurality of leads 52 and 54 may be any desired length depending upon the thickness of the semiconductor device 14 and the insulating tape 16. The third semiconductor device portions 60 and 70 of the second plurality and third plurality of leads 52 and 54, respectively, are adhesively secured to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality of 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 2:
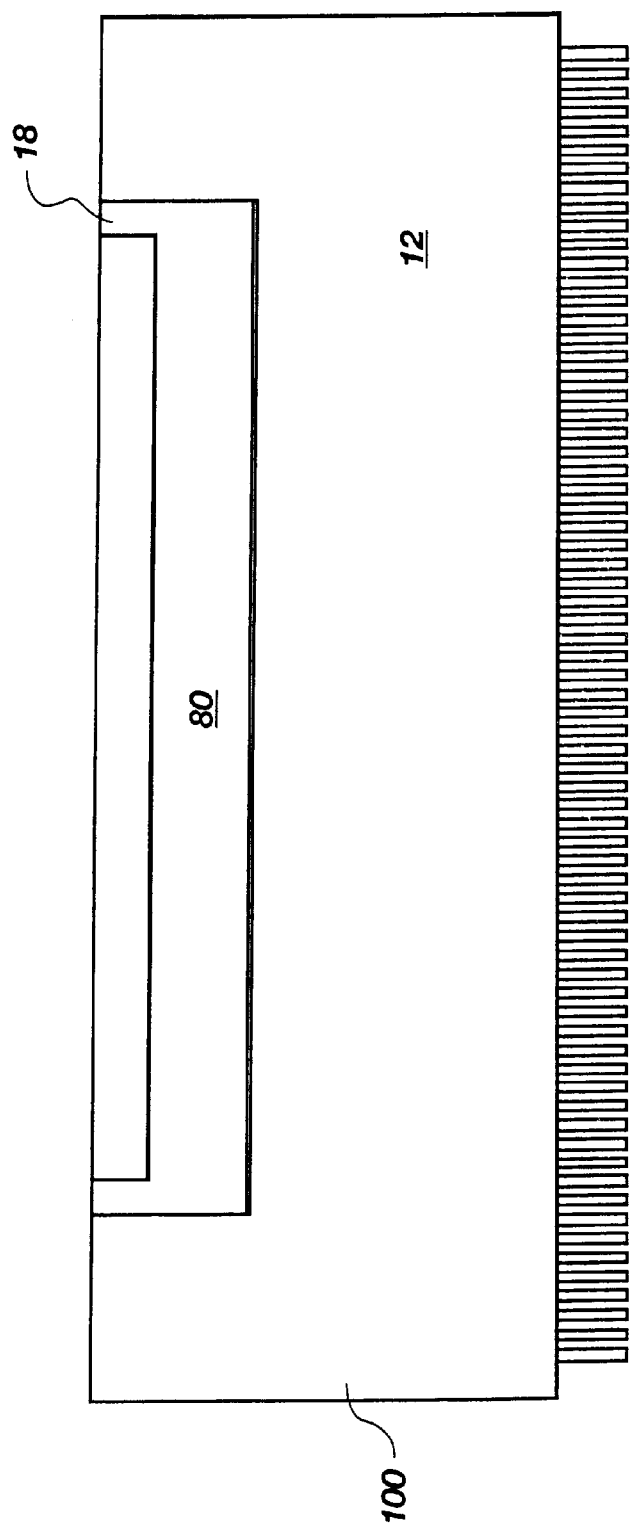
FIG. 2 is a side view of the other side of a first embodiment of the present invention mounted in a vertical surface mount package.

Referring to drawing FIG. 2, the second or other side 100 of the integrated circuit package 10 of the present invention is shown in a vertical surface mount package configuration. The other side of the u-shaped semiconductor device retainer 18 is illustrated in relation to the second or other side 100 of the integrated circuit package 10. The portion 80 of the semiconductor device retainer 18 resiliently engages the second side 100 of the substrate 12. If desired, the portion 80 may be secured to the substrate 12, such as by attachment with any suitable well known adhesive material.

Figure 3:
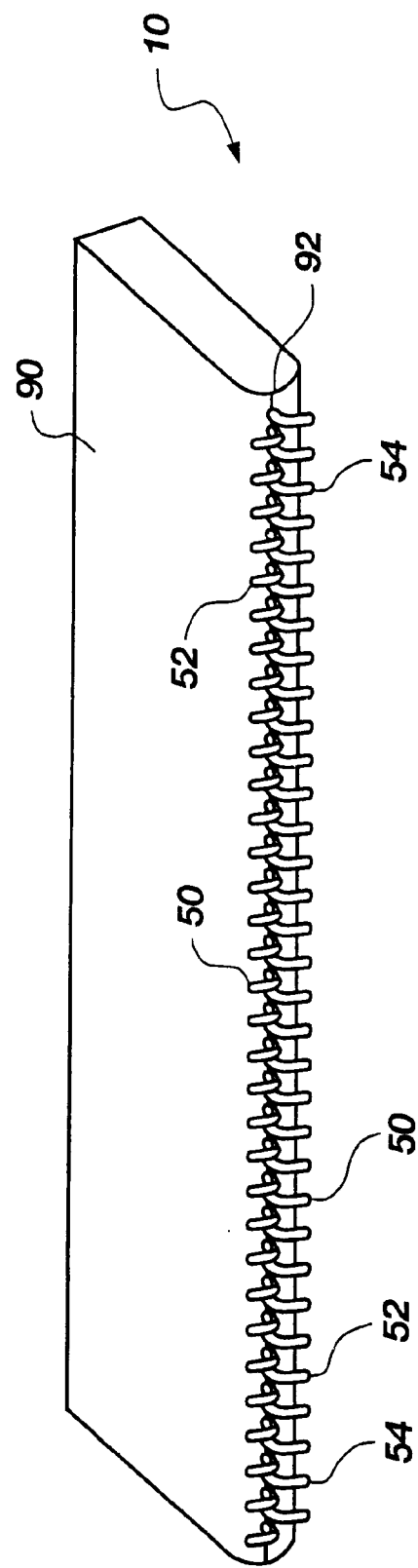
FIG. 3 is a perspective view of the present invention being encapsulated with the connectors of the lead frame extending therefrom.

Referring to drawing FIG. 3, the integrated circuit package 10 of the present invention in a vertical surface mount package configuration is shown encapsulated in emcapsulation material 90. The encapsulation material 90 may be of any suitable well known type, such as plastic, plastic with filler material therein, etc. As illustrated, the connectors 50, 52, and 54 extend from the edge 92 of the encapsulating material 90 being deformed in opposite directions therealong for subsequent connection to circuits of a printed circuit board (not shown).

Figure 4:
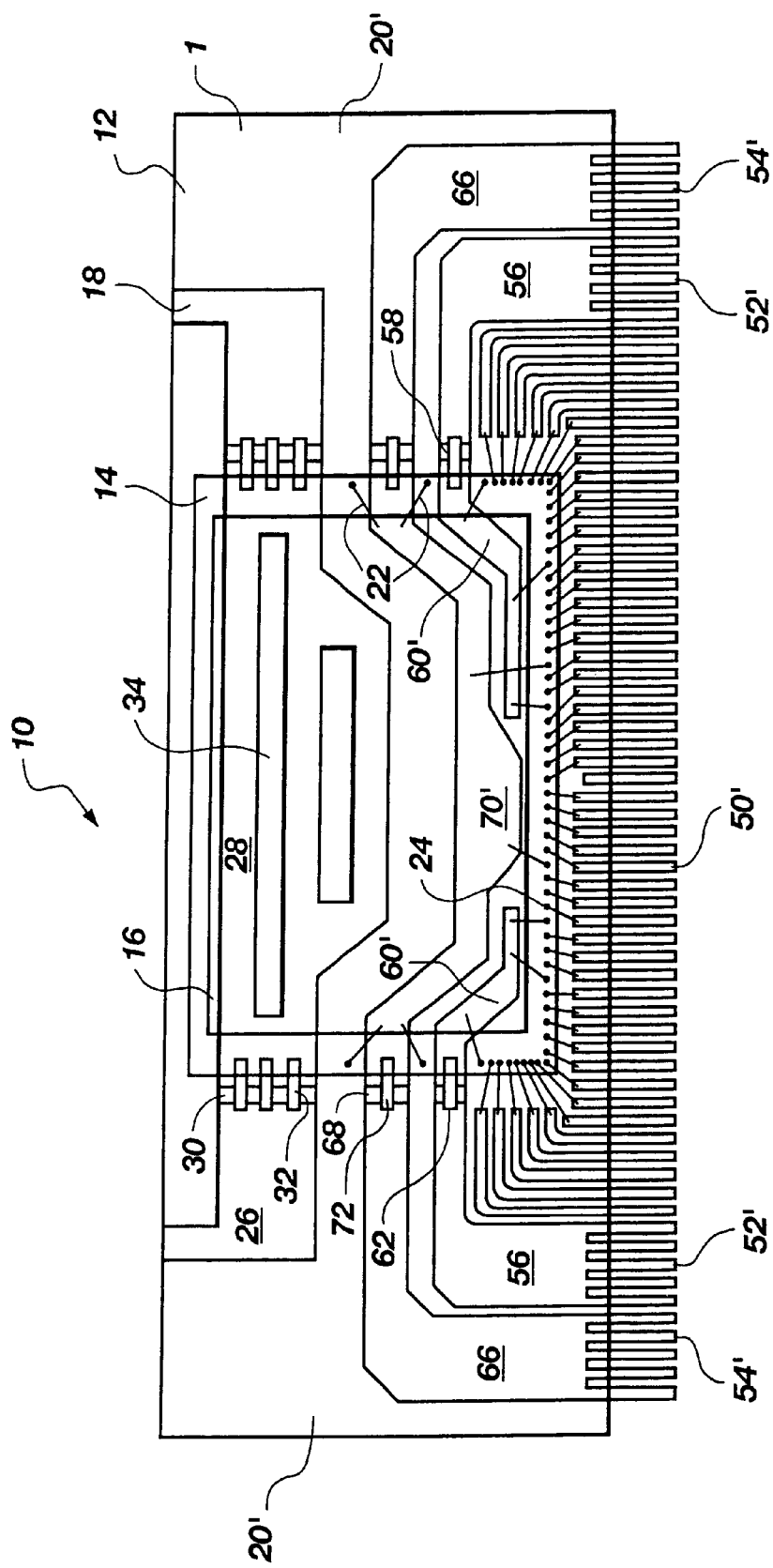
FIG. 4 is a side view of one side of a second embodiment of the present invention mounted in a vertical surface mount package.

Referring to drawing FIG. 4, the first side 1 of a second embodiment of the integrated circuit package 10 of the present invention is shown. The integrated circuit package 10 comprises a substrate 12, semiconductor device 14, insulating tape 16, semiconductor device retainer 18, lead frame 20', and wire bond interconnections 22. As illustrated, the semiconductor device 14 is a Leads-Over-Chip (LOC) configuration with respect to the lead frame 20'.

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active surface thereof.

The insulating tape 16 comprises any suitable well known type insulating tape which may be adhesively coated to secure portion of the lead frame 20' thereto and the insulating tape 16 to the semconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third transition portion 30 between the first portion 26 and second raised portion 28, one or more slotted openings 32 are included in the semiconductor device retainer 18. If deisred, other openings 34 may be included in the second raised portion 28 to aid in the forming thereof. Further, if desired, the second raised portion 28 of the semiconductor retainer device 18 may be adhesively attached to the insulating tape 16 through the use of well known suitable adhesives.

The lead frame 20' comprises a first plurality of leads 50' (see FIG. 4), a second plurality of leads 52' commonly connected over a portion of the length thereof, and a third plurality of leads 54' commonly connected over a portion thereof. As illustrated, the second plurality of leads 52' is commonly connected, forming a unitary lead including a first portion 56 generally contracting the substrate 12, second transition portion 58 having, in turn, slotted opening 62 therein, and third semiconductor device portions 60' which terminate at a distance overlaying a portion of the semiconductor device 14. The third semiconductor device portions 60' of the second plurality of leads 52' are insulated from electrical contact with the active surface of the semiconductor device 14 by the insulating tape 16. As illustrated, the third plurality of leads 54' is commonly connected, forming a unitary lead including a first portion 66 generally contacting the surface of the substrate 12, a second transition portion 68 having slotted opening 72 therein, and third semiconductor device portion 70' which has a portion thereof extending adjacent and/or in between the ends of the portions 60' of the leads 52'. The third semiconductor device portion 70' is insulated from the active surface of the semiconductor device 14 by the insulating tape 16. The transition portions 58 and 68 of the second plurality and third plurality of leads 52' and 54' respectively, may be any desired length depending upon the thickness of the semiconductor device 14 and the insulating tape 16. The third semiconductor device portions 60' and 70' of the second plurality and third plurality of leads 52' and 54', respectively, are adhesively secured to the insulating tape 16 through the use of well known suitable adhesives.

As illustrated, the second plurality of leads 52' and third plurality of leads 54' are used for the $V_{cc}$ and $V_{ss}$ functions of the seiconductor device 14. In this manner, by commonly connecting the second plurality of leads 52' and third plurality of leads 54' in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52' and third plurality of leads 54' in areas except the portions of the leads which extend beyond the substrate 12, the impedance of the second plurality 52' and third plurality 54' of leads is similar to that of the first plurality of leads 50.

A plurality of wire bond interconnections 22 interconnect the bond pads 24 on the active surface of the semiconductor device 14 and the first 50', second 52' , and third 54' pluralities of leads. The wire bond interconnections 22 are made using suitable well known wire bonding devices.

Figure 5:
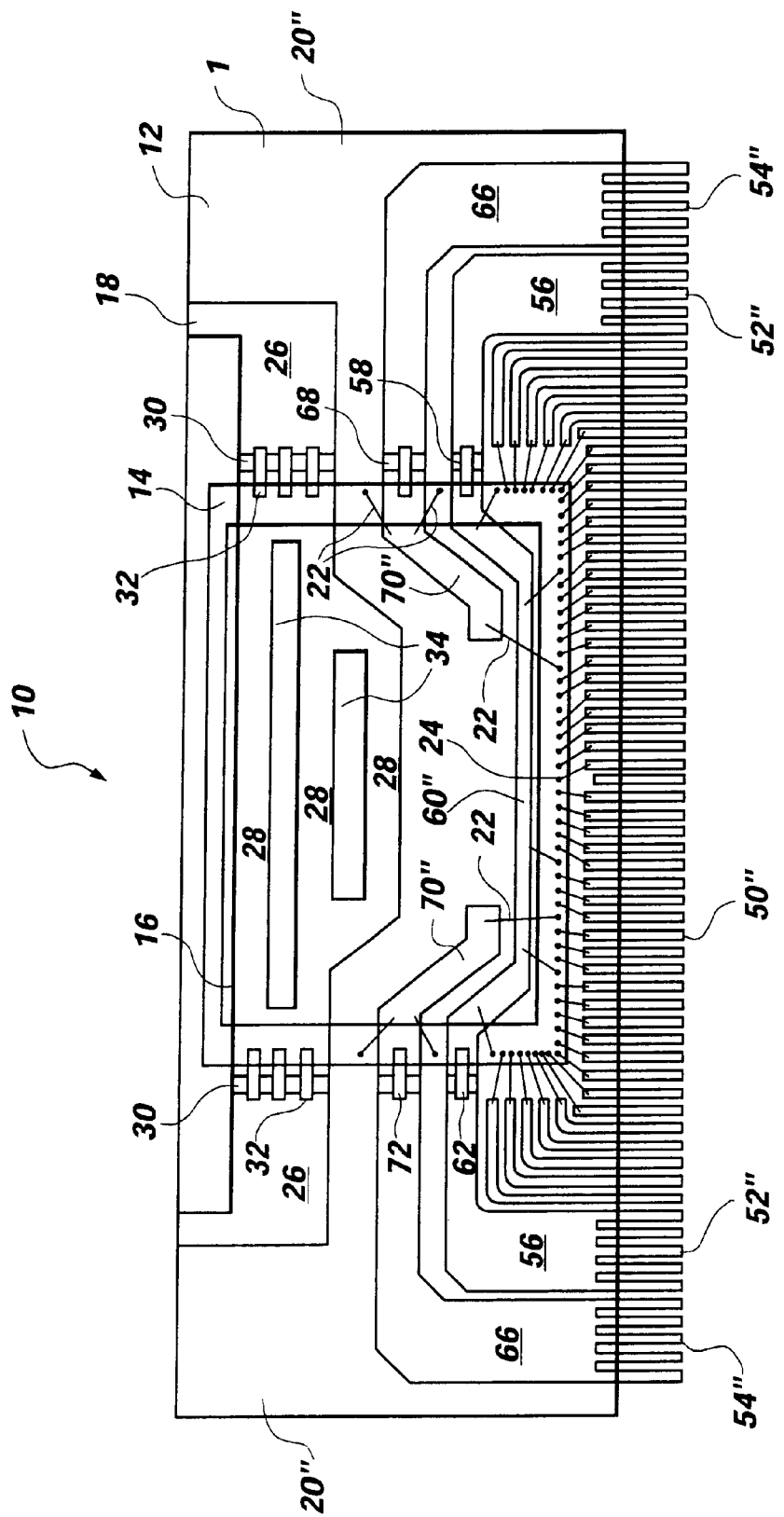
FIG. 5 is a side view of one side of a third embodiment of the present invention mounted in a veritcal surface mount package.

Referring to drawing FIG. 5, the first side 1 of a third embodiment of the integrated circuit package 10 of the present invention is shown. The integrated circuit package 10 comprises a substrate 12, semiconductor device 14, insulating tape material 16, semiconductor device retainer 18, lead frame 20", and wire bond interconnections 22. As illustrated, the semiconductor device 14 is a Leads-Over-Chip (LOC) configuration with respect to the lead frame 20".

The substrate 12 comprises any suitable well known substrate for use with the semiconductor device 14. The semiconductor device 14 may be secured to the first side of the substrate 12 by any suitable means, such as adhesive attachment, if desired.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Programmable Read-Only Memory (EEPROM) dice, and processor dice. The semiconductor device 14 includes at least one or a plurality of bond pads 24 on the active surface thereof.

The insulating tape material 16 comprises any suitable well known type insulating tape which may be adhesively coated to secure portions of the lead frame 20" thereto and the insulating tape 16 to the semiconductor device 14. A suitable type insulating tape includes Kapton™ tape which may be adhesively coated on one or both sides thereof.

The semiconductor device retainer 18 comprises a u-shaped member having a first portion 26 thereof extending along the first side of the substrate 12 in contact therewith, a second raised portion 28 thereof extending over a portion of the semiconductor device 14 and a portion of the insulating tape 16, and a third transition portion thereof 30 connecting the first portion 26 and second raised portion 28. The third transition portion 30 may be of any desired length depending upon the thickness of the semiconductor device 14 and the insulating tape 16. To aid in forming the third portion 30 between the first portion 26 and second raised portion 28, one or more slotted openings 32 are included in the semiconductor device retainer 18. If desired, other openings 34 may be included in the second raised portion 28 to aid in the forming thereof. Further, if desired, the second raised portion 28 of the semiconductor retainer device 18 may be adhesively attached to the insualting tape 16 through the use of well known suitable adhesives.

The lead frame 20" comprises a first plurality of leads 50", a second plurality of leads 52" commonly connected over a portion of the length thereof, and a third plurality of leads 54" commonly connected over a portion thereof. As illustrated, the second plurality of leads 52" is commonly connected, forming a unitary lead including a first portion 56 generally contacting the substrate 12, second transition portion 58 having, in turn, slotted opening 62 therein, and third semiconductor device portion 60" overlaying a portion of the semiconductor device 14. The third semiconductor device portion 60" of the second plurality of leads 52" is insulated from electrical contact with active surface of the semiconductor device 14 by the insulating tape 16. As illustrated, the third plurality of leads 54" is commonly connected, forming a unitary lead including a first portion 66 generally contacting the surface of the substrate 12, a second transition portion 68 having slotted opening 72 therein, and third semiconductor device portions 70" which have a portion thereof extending adjacent the portion 60" of the leads 52". The third semiconductor device portions 70" are insulated from the active surface of the semiconductor device 14 by the insulating tape 16. The transition portions 58 and 68 of the second plurality and third plurality of leads 52" and 54", respectively, may be any desired length depending upon the thickness of the semiconductor device 14 and the insulating tape 16. The third semiconductor device portions 60" and 70" of the second plurality and third plurality of leads 52" and 54", respectively, are adhesively secured to the insulating tape 16 throught the use of well known suitable adhesives.

As illustrated, the second plurality of leads 52" and third plurality of leads 54" are used for the $V_{cc}$ and $V_{ss}$ functions of the semiconductor device 14. In this manner, by commonly connecting the second plurality of leads 52" and third plurality of leads 54" in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52" and third plurality of leads 54" in areas except the portions of the leads which extend beyond the substrate 12, the impedance of the second plurality 52" and third plurality 54" of leads is similar to that of the first plurality of leads 50".

A plurality of wire bond interconnections 22 interconnect the bond pads 24 on the active surface of the semiconductor device 14 and the first 50", second 52", and third 54" pluralities of leads. The wire bond interconnections 22 are made usinf suitable well known wire bonding devices.

Figure 6:
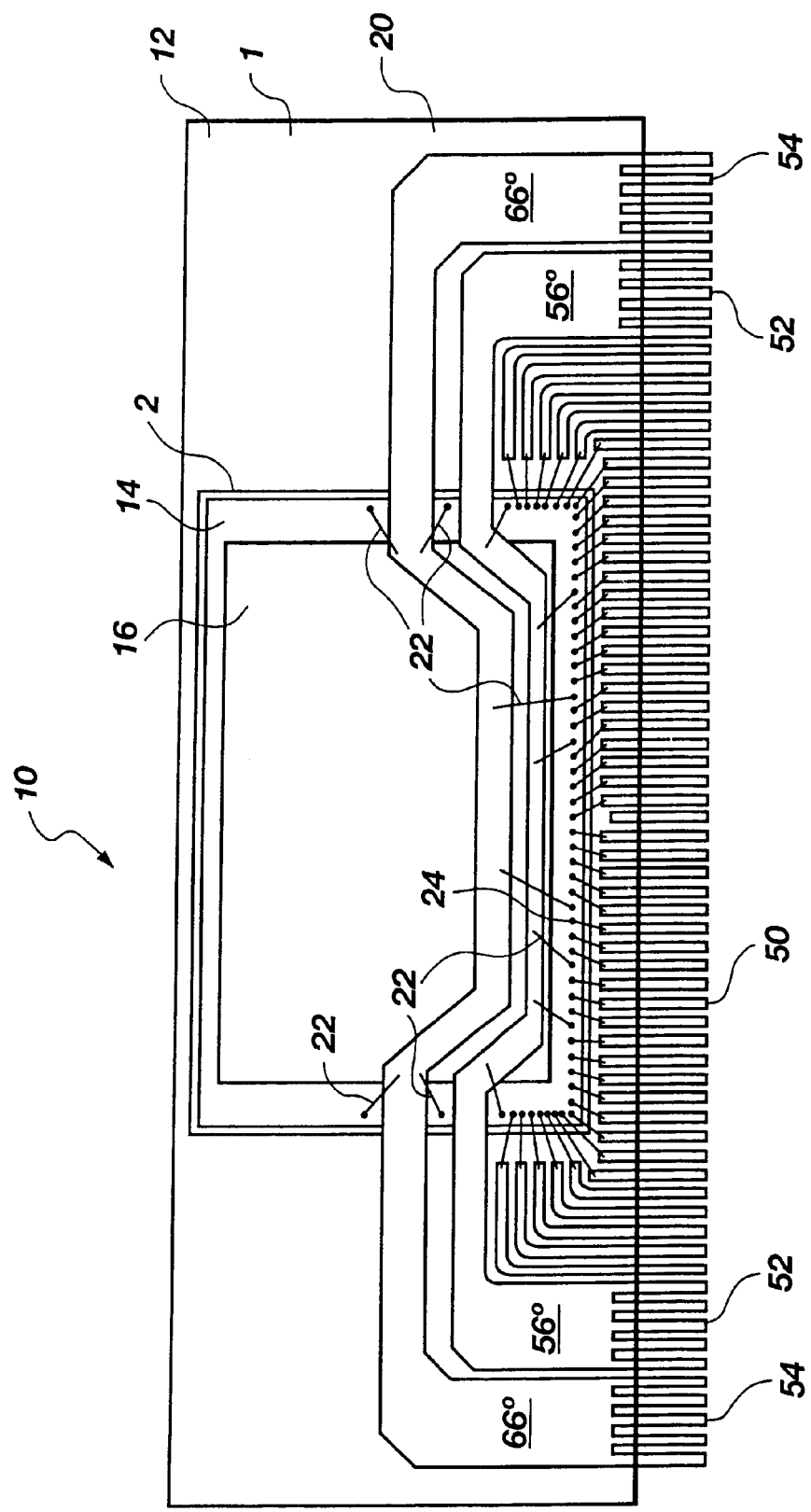
FIG. 6 is a side view of one side of a fourth embodiment of the present invention mounted in a vertical surface mount package.

Referring to drawing FIG. 6, the first side 1 of a fourth embodiment of the integrated circuit package 10 of the present invention is shown. The integrated circuit package 10 comprises a substrate 12, semiconductor device 14, insulating tape material 16, semiconductor device retainer 118 (shown in FIG. 7), lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Eraseable Programmable Read-Only Memory (EEPROM) dice, and processor dice. The semiconductor device 14 inlcudes at least one or a plurality of bond pads 24 on the active thereof.

The insulating tape 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof. The insulating tape 16 extends over any desired portion of the active surface of the semiconductor device 14 for electrical insualtion purposes of the active surface from the lead frame 20.

The lead frame 20 comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a unitary lead including a first portion 56 generally overlaying a portion of the semiconductor device 14. The portion 56 of the second plurality of leads 52 is insulated from electrical contact with the active surface of the semiconductor device 14 by the insulating tape 16. As illustrated, the third plurality of leads 54 is commnoly connected, forming a unitary lead including a first portion 66 generally overlaying a portion of the semiconductor device 14. The first semiconductor device portion 66 is insulated from the active surface of the semiconductor deive 14 by the insulating tape 16. The portions 56 and 66 of the second plurality and third plurality of leads 52 and 54, respectively, are sdhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extends beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 7:
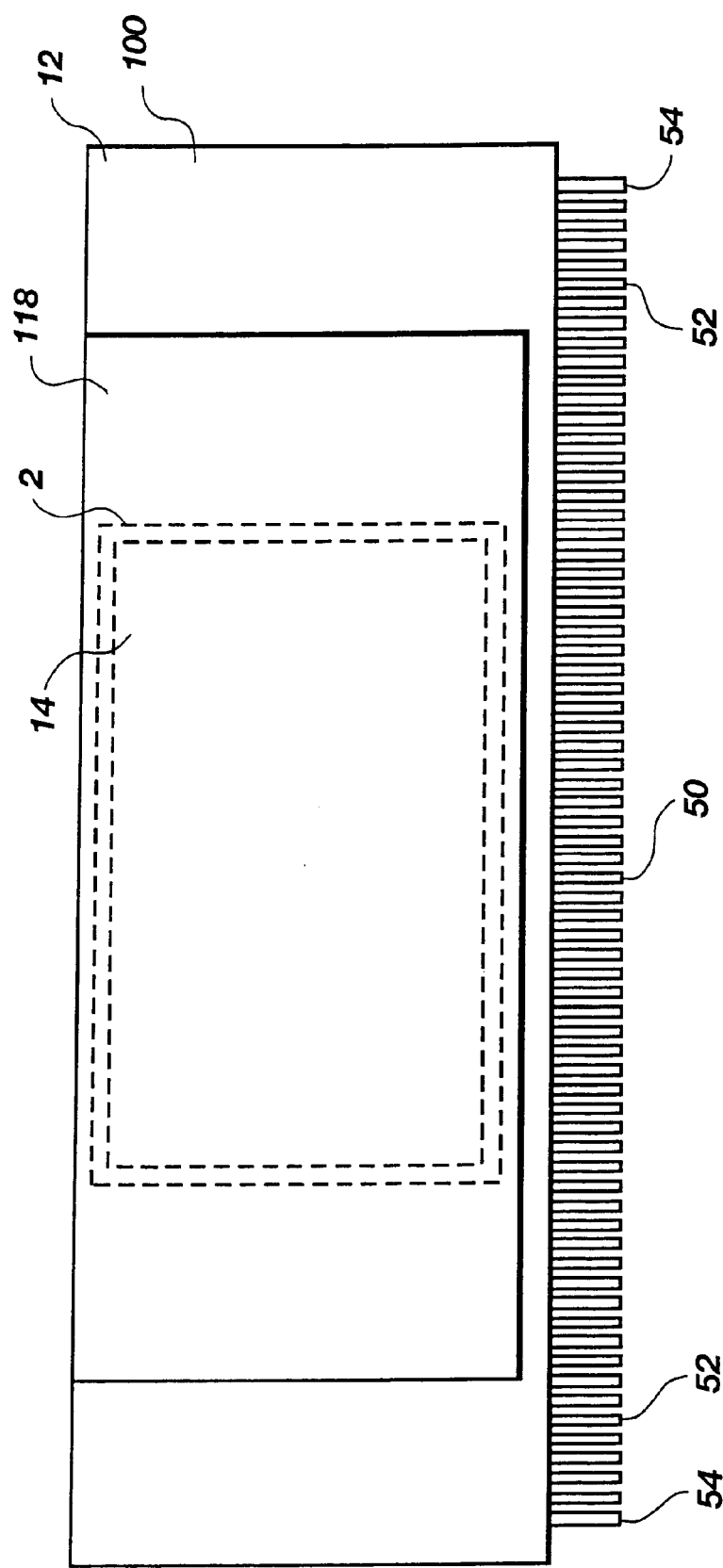
FIG. 7 is a side view of the other side of the fourth embodiment of the present invention mounted in a vertical surface mount package.

Referring to drawing FIG. 7, the second or other side 100 of the integrated circuit package 10 of the present invention shown in drawing FIG. 6 is illustrated. The semiconductor device retainer 118 to which the semiconductor device 14 is mounted through the use of suitable well known adhesives is illustrated in relation to the second or other side 100 of the integrated circuit package 10 and the aperture 2 therethrough. The semiconductor device retainer 118 is adhesively secured to the other side 100 of the integrated circuit package 10 by means of suitable well known adhesives. The semiconductor device retainer 118 may be made of any suitable material, such as metal, plastic, ceramic, etc. When the semiconductor retainer device is used as a heat sink for the semiconductor device 14 to conduct heat therefrom during operation, the semiconductor device is preferably made of a compatible metal or ceramic having a coefficient of expansion comparable to that of the semiconductor device 14. For such purposes, a silver epoxy may be used to adhesively secure the semiconductor device to the semiconductor retainer device 118.

Figure 8:
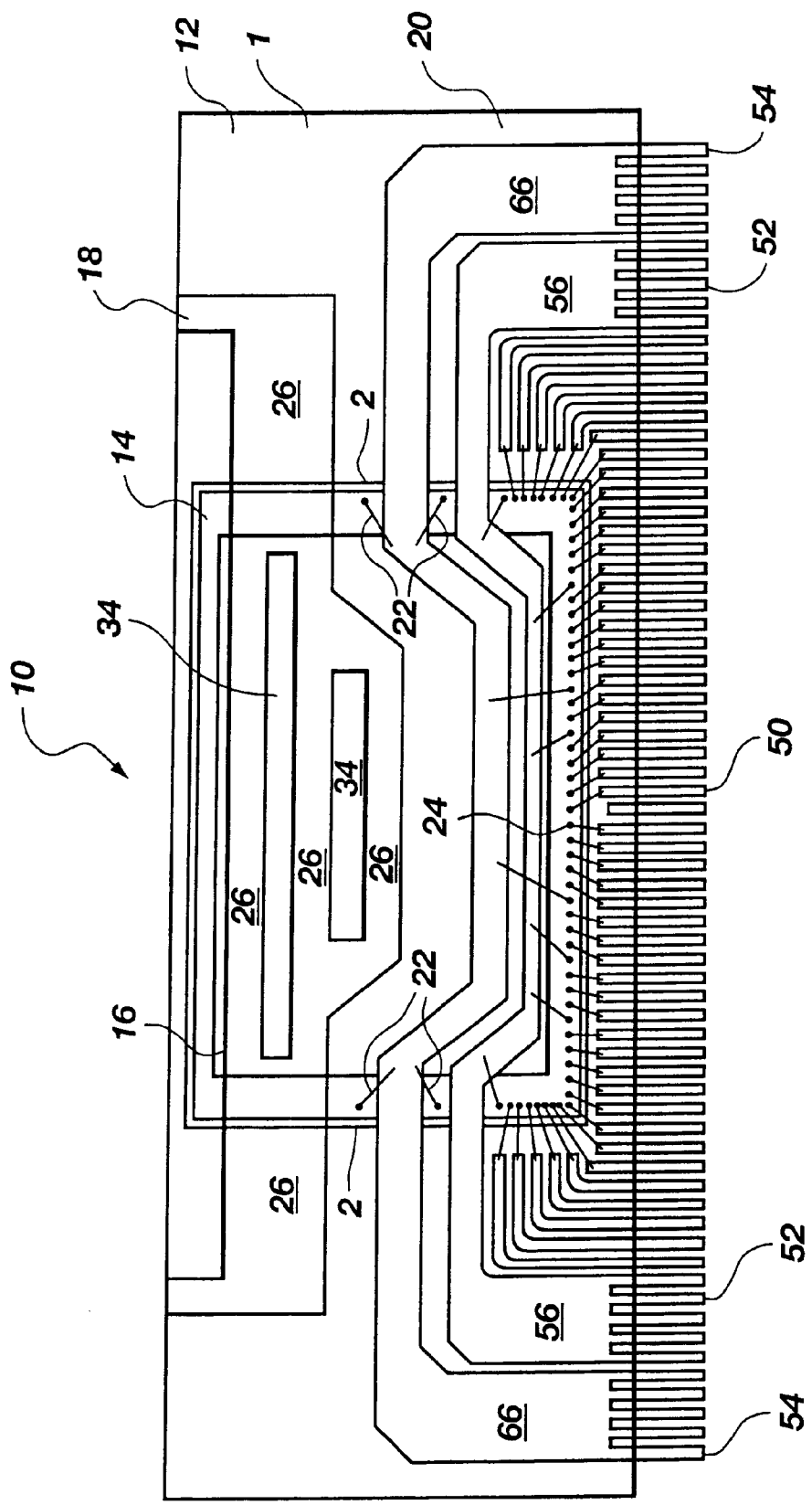
FIG. 8 is a side view of one side of a fifth embodiment of the present invention mounted in a vertical surface mount package.

Referring to drawing FIG. 8, the first side 1 of a fifth embodiment of the integrated circuit package 10 of the present invention is shown. The integrated circuit package 10 comprises a substrate 12, semiconductor device 14, insulating tape material 16, semiconductor device retainer 18, lead frame 20, and wire bond interconnections 22. As illustrated, the semiconductor device 14 is a modified Leads-Over-Chip (LOC) configuration with respect to the lead frame 20.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or plurality of bonds pads 24 on the active surface thereof.

The insulating tape 16 comprises any suitable well known type insulating tape which may be adhesively coated to secure portions of the lead frame 20 thereto and the insulating tape 16 to the semiconductor device 14. A suitable type insulating tape includes Kapton™ tape which may be adhesively coated on one or both sides thereof. The insulating tape 16 extends over any desired portion of the active surface of the semiconductor device 14 for electrical insualtion purposes of the active surface from the lead frame 20.

The semiconductor device retainer 18 comprises a u-shape member having a first portion 26 thereof extending along the first side of the substrate 12 in contact therewith and extending over a portion of the semiconductor device 14 having insulating tape 16 thereon. To aid in forming the first portion 26, one or more slotted openings 34 are included in the semiconductor device retainer 18. Further, if desired, the first portion 26 of the semiconductor retainer device 18 may be adhesively attached to the insulating tape 16 through the use of well known suitable adhesives. The portion (not shown in FIG. 8) of the semiconductor device retainer 18 contacting side 100 of the substrate 12 is as known and described as semiconductor retainer device 118 in drawing FIG. 7.

The lead frame 20 comprises a first plurality of leads 50 secured to substrate 12 by any suitable well known means, such as adhesive bonding, a second plurality of leads 52 commonly connected over a portion of the length thereof, and a third plurality of leads 54 commonly connected over a portion thereof. As illustrated, the second plurality of leads 52 is commonly connected, forming a unitary lead including a first portion 56 generally overlaying a portion of the semiconductor device 14. The first portion 56 of the second plurality of leads 52 is insulated from electrical contact with the active surface of the semiconductor device 14 by the insulating tape 16. As illustrated, the third plurality of leads 54 is commonly connected, forming a unitary lead including a first portion 66 generally overlaying a portion of the semiconductor device 14. The first semiconductor device portion 66 is insulated from the active surface of the semiconductor device 14 by the insulating tape 16. The portions 56 and 66 of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in ares except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 9:
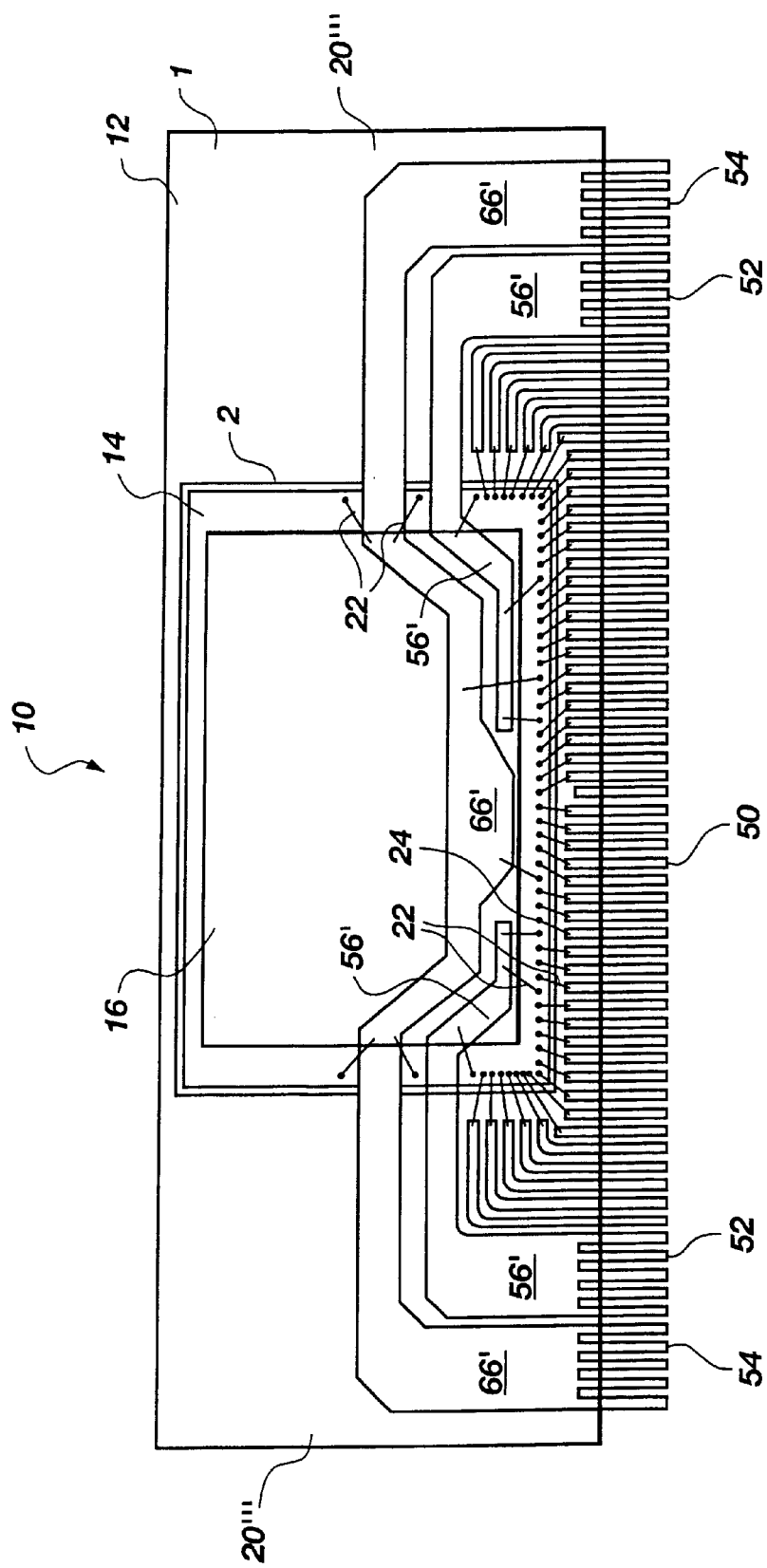
FIG. 9 is a side view of one side of a sixth embodiment of the present invention mounted in a vertical surface mount package.

Referring to drawing FIG. 9, the first side 1 of a sixth embodiment of the integrated circuit package 10 of the present invention is shown. The integrated circuit package 10 comprises a substrate 12, semiconductor device 14, insulating tape material 16, semiconductor device retainer 118 (see FIG. 7), lead frame 20''', and wire bond interconnections 22. As illustrated, the semiconductor device 14 is a modified Leads-Over-Chip (LOC) configuration with respect to the lead frame 20'''.

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The seimconductor device 14 includes at least one or a plurality of bond pads 24 on the active surface thereof.

The insulating tape material 16 comprises any suitable well known type insulating tape which may be adhesively coated to secure portions of the lead frame 20''' thereto and the insulating tape 16 to the semiconductor device 14. A suitable type insulating tape includes Kapton™ tape which may be adhesively coated on one or both sides thereof.

The lead frame 20''' comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a unitary lead including a first portion 56' generally overlaying a portion of substrate 12 and the semiconductor device 14. The first portion 56' of the second plurality of leads 52 is insulated from electrical contact with the active surface of the semiconductor device 14 by the insulating tape 16. As illustrated, the third plurality of leads 54 is commonly connected, forming a unitary lead including a first portion 66' generally overlaying a portion of the substrate 12 and the semiconductor device 14. The first semiconductor device portion 66' is insulated from the active surface of the semiconductor device 14 by the insulating tape 16. The portions 56' and 66' of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 10:
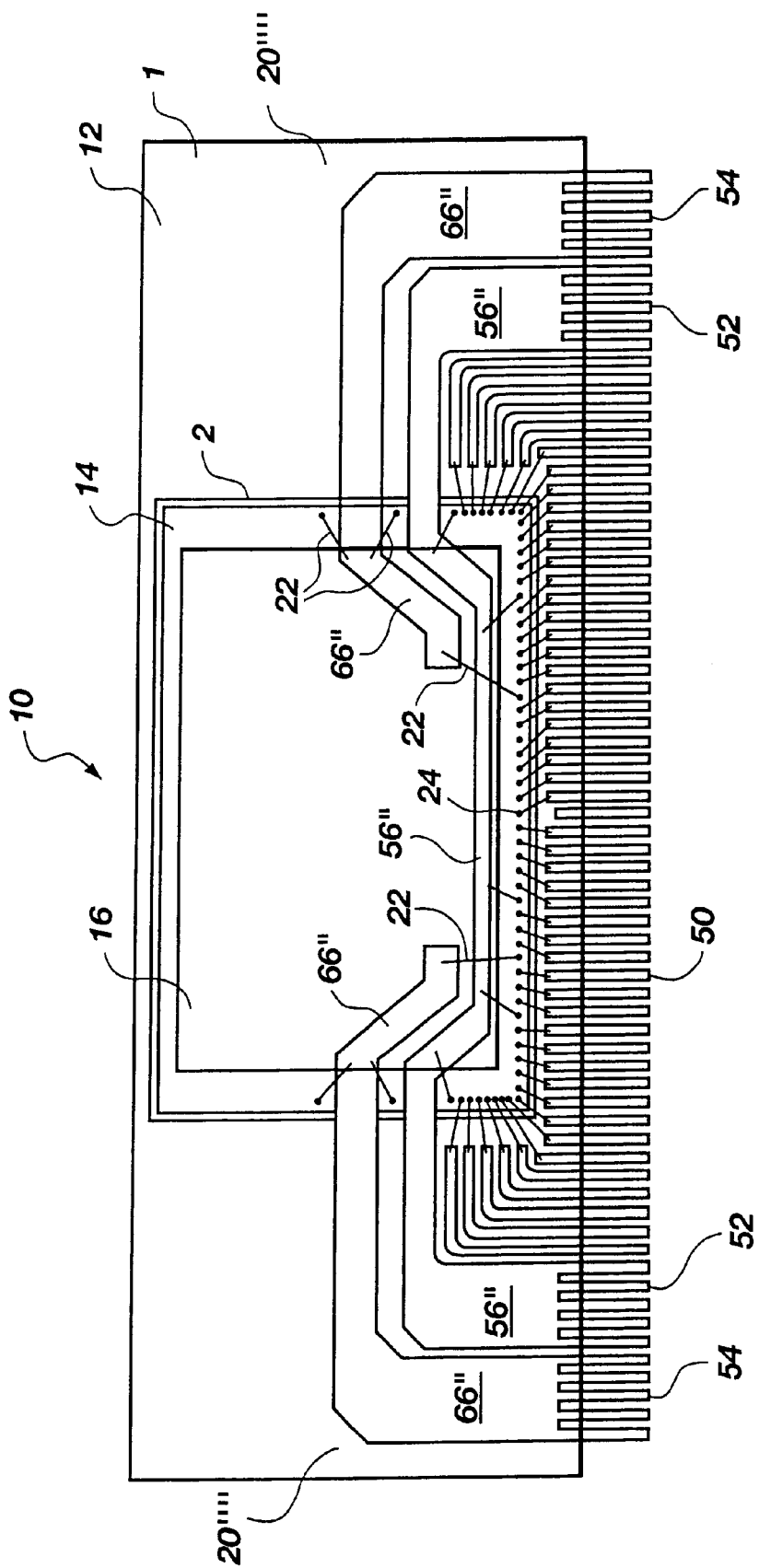
FIG. 10 is a side view of one side of seventh embodiment of the present invention mounted in a vertical surface mount package.

Referring to drawing FIG. 10, the first side 1 of the seventh embodiment of the integrated circuit package 10 of the present invention is shown. The integrated circuit package 10 comprises a substrate 12, semiconductor device 14, insulating tape material 16, semiconductor device retainer 118 (see FIG. 7), lead frame 20'''', and wire bond interconnections 22. As illustrated, the semiconductor device 14 is a modified Leads-Over-Chip (LOC) configuration with respect to the lead frame 20''''.

The substrate 12 comprises any suitable well known substrate for use with the semiconductor device 14. The semiconductor device 14 is contained or received within an aperture 2 extending partially and completely therethrough to the other side (see FIG. 7) of the substrate 12.

The semiconductor device 14 comprises any suitable type semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, flash Electrically Erasable Programmable Read-Only Memory (EEPROM) dice, and processor dice. The semiconductor device 14 includes at least one or a plurality of bond pads 24 on the active suface thereof.

The insulating tape material 16 comprises any suitable well known type insulating tape which may be adhesively coated to secure portions of the lead frame 20'''' thereto and the insulating tape 16 to the semiconductor device 14. A suitable type insulating tape includes Kapton™ tape which may be adhesively coated on one or both sides thereof.

The lead frame 20'''' comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a lead including a first portion 56'' generally overlaying a portion of substrate 12 and the semiconductor device 14. The first portion 56'' of the second plurality of leads 52 is insulated from electrical contact with the active surface of the semiconductor device 14 by the insulating tape 16. As illustrated, the third plurality of leads 54 is commonly connected, forming a lead including a first portion 66'' generally overlaying a portion of the substrate 12 and the semiconductor device 14. The first semiconductor device portion 66'' is insulated from the active surface of the semiconductor device 14 by the insulating tape 16. The portions 56'' and 66'' of the second plurality and third plurality of leads 52 and 54, respectively, are adhesively secured to the substrate, if desired, and to the insulating tape 16 through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

Figure 11:
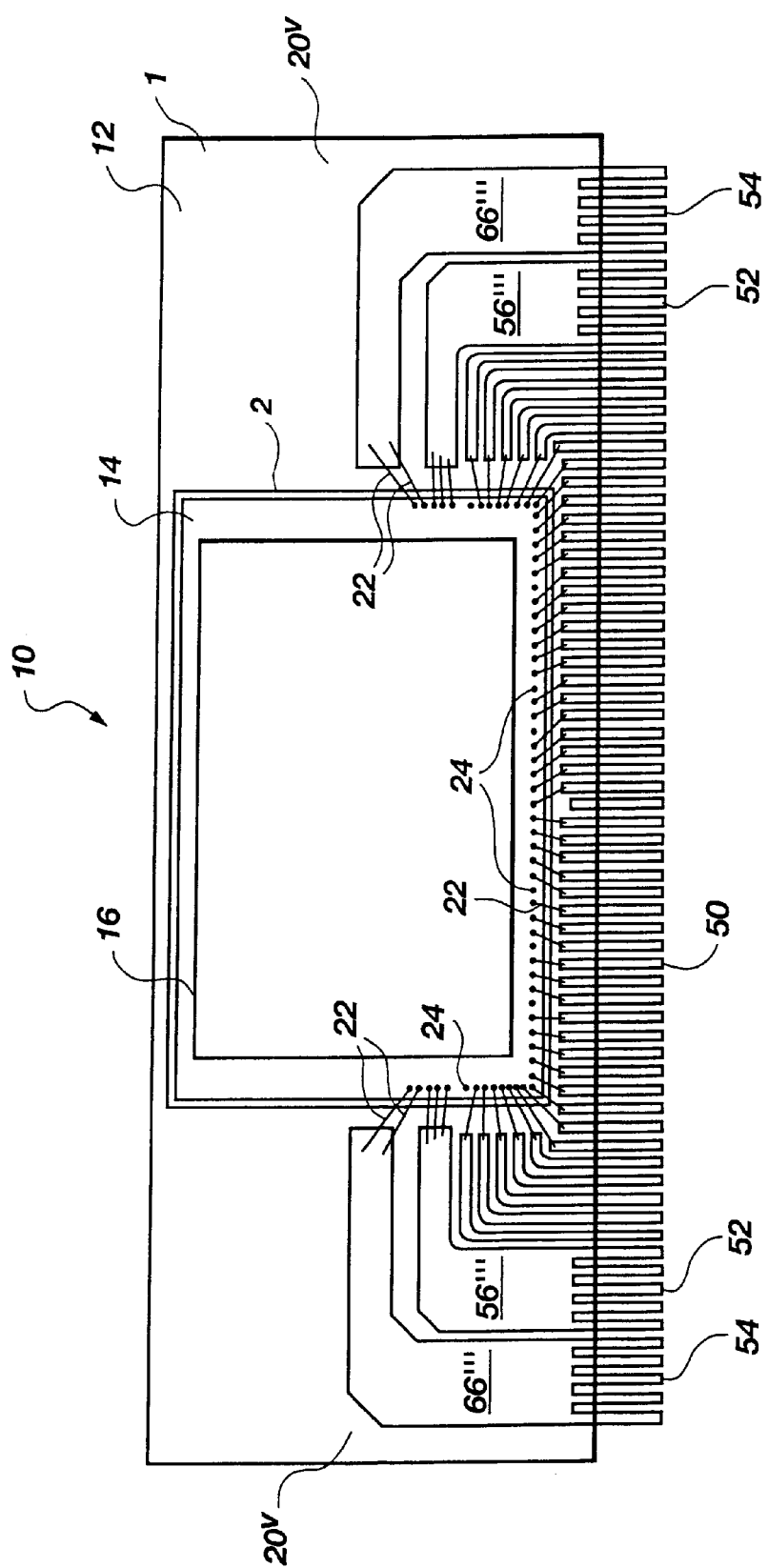
FIG. 11 is a side view of one side of an eighth embodiment of the present invention mounted in a vertical surface mount package.

Referring to drawing FIG. 11, the first side 1 of the eighth embodiment of the integrated circuit package 10 of the present invention is shown. The integrated circuit package 10 comprises a substrate 12, semiconductor device 14, insulating covering or coating 16 on the semiconductor device 14, semiconductor device retainer 118 (see FIG. 7), lead frame 20", and wire bond interconnections 22. As illustrated, the semiconductor device 14 is a conventional lead frame configuration with respect to the lead frame 20".

The substrate 12 comprises any suitable well known substrate for use with the semiconductor device 14. The semiconductor device 14 is contained or received within an aperture 2 extending partially or completely therethrough to the other side 100 (see FIG. 7) of the substrate 12.

The semiconductor device 14 comprises any suitable semiconductor device, such as Dynamic Random Access Memory (DRAM) dice, Static Random Access Memory (SRAM) dice, Synchronous DRAM (SDRAM) dice, Sequential Graphics Random Access Memory (SGRAM) dice, falsh Electrically Erasable Programmable Read-Only Memory (EEPROM) dice, and processor dice. The semiconductor device 14 includes at least one or a pluality of bond pads 24 on the active surface thereof.

The insulating covering or coating 16 comprises any suitable well known type insulating covering (tape) or coating, such as spun-on-glass, which may be attached or coated to portions of the semiconductor device 14. A suitable type insulating tape includes Kapton™ tape which may be adhesively coated on one or both sides thereof.

The lead frame 20" comprises a first plurality of leads 50, a second plurality of leads 52 commonly connected over a portion of the length thereof, and a third plurality of leads 54 commonly connected over a portion thereof. As illustrated, the second plurality of leads 52 is commonly connected, forming a lead including a first portion 56'" generally overlaying a portion of substrate 12. The first portion 56'" of the second plurality of leads 52, if desired, may be insulated from electrical contact with the substrate 12 by any well known suitable means. As illustrated, the third plurality of leads 54 is commonly connected, forming a lead including a first portion 66'" generally overlaying a portion of the substrate 12. The first semiconductor device portion 66'" is insulated from the surface of the substrate 12 by any suitable well known means. The portions 56'" and 66'" of the second plurality and third plurality of leads 52 and 54, respectively, may be adhesively secured to the substrate, if desired, through the use of well known suitable adhesives.

As illustrated, the second plurality of leads 52 and third plurality of leads 54 are used for the $V_{cc}$ and $V_{ss}$ functions of the semiconductor device 14. In this manner, by commonly connecting the second plurality of leads 52 and third plurality of leads 54 in areas except the portions of the leads which extend beyond the substrate 12, the impedance of the commonly connected leads is reduced, thereby allowing semiconductor devices 14 having higher operating frequencies to be used in the integrated circuit package 10. Also, by commonly connecting the second plurality of leads 52 and third plurality of leads 54 in areas except the portions of the leads which extend beyond the substrate 12, the impedance of the second plurality 52 and third plurality 54 of leads is similar to that of the first plurality of leads 50.

A plurality of wire bond interconnections 22 interconnect the bond pads 24 on the active surface of the semiconductor device 14 and the first 50, second 52, and third 54 pluralities of leads. The wire bond interconnections 22 are made using suitable well known wire bonding devices.

From the foregoing it will be understood that changes, additions, deletions, and modifications may be made to the present invention hereinbefore described which fall within the scope of the claimed invention, such as the shape of the lead frame, shape of the semiconductor device, location of bond oads on the semiconductor device, the common unitary portions of the leads terminating over the semiconductor device, the common unitary portions of the leads terminating adjacent the semiconductor device, etc.

What is claimed is:

1. A semiconductor device package assembly comprising:
   a substrate having a first side and a second side thereof;
   a semiconductor device retained by the substrate, the semiconductor device having an active surface and at least one bond pad located thereon;
   insulation material covering a portion of the active surface of the semiconductor device, the insulation material including one of tape and an adhesive layer;
   a semiconductor device retainer retaining the semiconductor device regarding the substrate, the semiconductor device retainer having a portion engaging the first side of the substrate, aportion engaging the second side of the substrate, and a portion engaging a portion of the active surface of the semiconductor device;
   a lead frame having at least one lead thereon; and
   at least one electrical interconnection between the at least one lead of the lead frame and the at least one bond pad of the semiconductor device.

2. The semiconductor device package assembly of claim 1, wherein the semiconductor device is mounted on one side of the substrate.

3. The semiconductor device package assembly of claim 1, wherein the substrate contains an aperture therein.

4. The semiconductor device package assembly of claim 3, wherein the semiconductor device is retained within the aperture in the substrate.

5. The semiconductor device package assembly of claim 4, wherein the semiconductor device retainer engages a portion of the semiconductor device and a portion of the substrate.

6. The semiconductor device package assembly of claim 5, wherein the semiconductor device retainer engages a portion of the semiconductor device and a portion of the second side of the substrate.

7. The semiconductor device package assembly of claim 6, wherein the semiconductor device is attached to the semiconductor device retainer.

8. The semiconductor device package assembly of claim 1, wherein the semiconductor device includes a memory device.

9. The semiconductor device package assembly of claim 1, wherein the semiconductor device includes a processor.

10. The semiconductor device package assembly of claim 1, wherein the insulating material covering a portion of the active surface of the semiconductor device includes one of insulative tape having adhesive thereon and an insulative adhesive material.

11. The semiconductor device package assembly of claim 1, wherein the insulating material covering a portion of the active surface of the semiconductor device includes spun-on-glass.

12. The semiconductor device package assembly of claim 1, wherein the insulating material covering a portion of the active surface of the semiconductor device includes insulative tape adhesively coated on at least one side thereof.

13. The semiconductor device package assembly of claim 1, wherein the insulating material covering a portion of the active surface of the semiconductor device includes insulative tape adhesively coated on both sides thereof.

14. The semiconductor device package assembly of claim 1, wherein the semiconductor device retainer engages a portion of the semiconductor device and a portion of the second side of the substrate.

15. The semiconductor device package assembly of claim 1, wherein the semiconductor device retainer engages a portion of the semiconductor device and a portion of the first side and the second side of the substrate.

16. The semiconductor device package assembly of claim 1, wherein the lead frame includes a first plurality of leads, a second plurality of leads, and a third plurality of leads.

17. The semiconductor device package assembly of claim 1, wherein the lead frame includes a first plurality of leads, a second plurality of leads, and a third plurality of leads, the second plurality of leads having a portion thereof connected together.

18. The semiconductor device package assembly of claim 1, wherein the lead frame includes a first plurality of leads, a second plurality of leads, and a third plurality of leads, the third plurality of leads having a portion thereof connected together.

19. The semiconductor device package assembly of claim 1, wherein the lead frame includes a first plurality of leads, a second plurality of leads having a portion thereof connected together, and a third plurality of leads having a portion thereof connected together.

20. The semiconductor device package assembly of claim 1, wherein the lead frame includes a first plurality of leads, a second plurality of leads having a portion thereof connected together to form a substantially unitary lead, and a third plurality of leads having a portion thereof connected together to form a substantially unitary lead, at least a portion of the unitary lead portion of the second plurality of leads and a portion of the unitary lead portion of the third plurality of leads extending over a portion of the active surface of the semiconductor device.

21. The ssemiconductor device package assembly of claim 1, wherein the lead frame includes a first plurality of leads, a second plurality of leads having a portion thereof connected together to form a substantially unitary lead terminating adjacent the semiconductor device, and a third plurality of leads having a portion thereof connected together to form a substantially unitary lead terminating adjacent the semiconductor device.

22. The semiconductor device package assembly of claim 1, wherein the lead frame includes a first plurality of leads, a second plurality of leads having a portion thereof connected together to form a substantially unitary lead, the portion of the unitary lead portion of the second plurality of leads extending over a portion of the semiconductor device and terminating thereover, and a third plurality of leads having a portion thereof connected together to form a substantially unitary lead, a portion of the unitary lead portion of the third plurality of leads extending over a portion of the active surface of the semiconductor device.

23. The semiconductor device package assembly of claim 1, wherein the lead frame includes a first plurality of leads, a second plurality of leads having a portion thereof connected together to form a substantially unitary lead, the unitary portion of the second plurality of leads extending over a portion of the semiconductor device, and a third plurality of leads having a portion thereof connected together to form a substantially unitary lead, a portion of the unitary lead portion of the third plurality of leads extending over a portion of the active surface of the semiconductor device and terminating thereover.

24. The semiconductor device package assembly of claim 1, wherein the lead frame includes a first plurality of leads, a second plurality of leads having a portion thereof connected together overlaying a portion of the semiconductor device, and a third plurality of leads having a portion thereof connected together overlaying a portion of the semiconductor device.

25. The semiconductor device package assembly of claim 1, wherein the lead frame includes a first plurality of leads terminating adjacent the semiconductor device, a second plurality of leads having a portion thereof connected together overlaying a portion of the semiconductor device, and a third plurality of leads having a portion thereof connected together overlaying a portion of the semiconductor device.

26. A semiconductor device package assembly comprising:
   a substrate having a first side and a second side thereof;
   a semiconductor device attached to the substrate, the semiconductor device having an active surface and at least one bond pad located thereon;
   insulation material covering a portion of the active surface of the semiconductor device;
   a semiconductor retainer device retaining the semiconductor device in relation to the substrate, the semiconductor device retainer engaging a portion of the active surface of the semiconductor device and a portion of the second side of the substrate;
   a lead frame having at least one lead thereon; and
   at least one electrical interconnection between the at least one of the lead frame and the at least one bond pad of the semiconductor device.

27. A semiconductor device package assembly comprising:
   a substrate having a first side and a second side thereof;
   a semiconductor device attached to the substrate, the semiconductor device having an active surface and at least one bond pad located thereon;
   insulation material covering a portion of the active surface of the semiconductor device;
   a semiconductor retainer device retaining the semiconductor device in relation to the substrate, the semiconductor device retainer engaging a portion of the insulation material covering a portion of the active surface of the semiconductor device and engaging a portion of the first side and the second side of substrate;
   a lead frame having at least one lead thereon; and
   at least one electrical interconnection between the at least one lead of the lead frame and the at least one bond pad of the semiconductor device.

28. A semiconductor device package assembly comprising:
   a substrate having a first side and a second side thereof;
   a semiconductor device attached to the substrate, the semiconductor device having an active surface and at least one bond pad located thereon;
   insulation material covering a portion of the active surface of the semiconductor device;
   a semiconductor retainer device retaining the semiconductor device in relation to the substrate, said semiconductor retainer device engaging a portion of the second side of the substrate and engaging a portion of the active surface of the semiconductor device;
   a lead frame having at least one lead thereon, the lead frame including a first plurality of leads, a second plurality of leads having a portion thereof connected together to form a substantially unitary lead, and a third plurality of leads having a portion thereof connected together to form a substantially unitary lead, at least a portion of the unitary portion of the second plurality of leads and a portion of the unitary lead portion of the third plurality of leads extending over a portion of the active surface of the semiconductor device; and at least one electrical interconnection between the at least one lead of the lead frame and the at least one bond pad of the semiconductor device.

29. A semiconductor device package assembly comprising:

a substrate having a first side and a second side thereof;

a semiconductor device attached to the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and a portion of the active surface of the semiconductor device;

a lead frame having at least one lead thereon, the lead frame including a first plurality of leads, a second plurality of leads having a portion thereof connected together to form a substantially unitary lead terminating adjacent the semiconductor device, and a third plurality of leads having a portion thereof connected together to form a substantially unitary lead terminating adjacent the semiconductor device; and at least one electrical interconnection between the at least one lead of the lead frame and the at least one bond pad of the semiconductor device.

30. A semiconductor device package assembly comprising:

a substrate having a first side and a second side thereof;

a semiconductor device attached to the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and engaging a portion of the active surface of the semiconductor device;

a lead frame having at least one lead thereon, the lead frame including a first plurality of leads, a second plurality of leads having a portion thereof connected together to form a substantially unitary lead, a portion of the unitary lead portion of the second plurality of leads extending over a portion of the semiconductor device and terminating thereover, and a third plurality of leads having a portion thereof connected together to form a substantially unitary lead, a portion of the unitary lead portion of the third pluality of leads extending over a portion of the active surface of the semiconductor device; and at least one electrical interconnection between the at least one lead of the lead frame and the at least one bond pad of the semiconductor device.

31. A semiconductor device package assembly comprising:

a substrate having a first side and a second side thereof;

a semiconductor device attached to the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and engaging a portion of the active surface of the semiconductor device;

a lead frame having at least one lead thereon, the lead frame including a first plurality of leads, a second plurality of leads having a portion thereof connected together to form a substantially unitary lead, the unitary lead portion of the second plurality of leads extending over a portion of the semiconductor device, and a third plurality of leads having a portion thereof connected together to form a substantially unitary lead, a portion of the unitary lead portion of the third plurality of leads extending over a portion of the active of the semiconductor device and terminating thereover; and at least one electrical interconnection between the at least one lead of the lead frame and the at least one bond pad of the semiconductor device.

32. A semiconductor device package assembly comprising:

a substrate having a first side and a second side thereof;

a semiconductor device attached to the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and a portion of the active surface of the semiconductor device;

a lead frame having at least one lead thereon, the lead frame including a first plurality of leads, a second plurality of leads having a portion thereof connected together overlaying a portion of the semicondutor device, and a third plurality of leads having a portion thereof connected together overlaying a portion of the semiconductor device; and at least one electrical interconnection between the at least one lead of the lead frame and the at least one bond pad of the semiconductor device.

33. A semiconductor device package assembly comprising:

a substrate having a first side and a second side thereof;

a semiconductor device attached the substrate, the semiconductor device having an active surface and at least one bond pad located thereon;

insulation material covering a portion of the active surface of the semiconductor device;

a semiconductor retainer device retaining the semiconductor device in relation to the substrate, the semiconductor retainer device engaging a portion of the second side of the substrate and a portion of the active surface of the semiconductor device;

a lead frame having at least one lead theron, the lead frame including a first plurality of leads terminating adjacent the semiconductor device, a second plurality of leads having a portion thereof connected together overlaying a portion of the semiconductor device, and a third plurality of leads having a portion thereof connected together overlaying a portion of the semiconductor device; and at least one electrical interconnection between the at least one lead of the lead frame and the at least one bond pad of the semiconductor device.

* * * * *

UNITED STATES PATENT AND TRADEMARK OFFICE
CERTIFICATE OF CORRECTION

PATENT NO.    : 6,414,378 B1
DATED         : July 2, 2002
INVENTOR(S)   : David J. Corisis and Brent Keeth It is certified that error appears in the above-identified patent and that said Letters Patent is hereby corrected as shown below:

Column 1,
Line 13, change "FILED" to -- FIELD --
Line 48, after "leads" and before "connected" insert -- which extend under an IC die to attach to and support the die from below while being --

Column 2,
Lines 18 and 19, change "colt" to -- volt --
Line 20, change "sugnificant" to -- significant --
Line 28, change "carious" to -- various --
Line 38, change "ywo" to -- two --

Column 3,
Line 5, change "VIEW" to -- VIEWS --
Line 16, change "thereform" to -- therefrom --
Line 52, delete "material"

Column 4,
Lines 2-3, change "seimconductor" to -- semiconductor --
Line 5, before "16" delete "material"
Line 6, change "amy" to -- may --
Line 16, change "thereof 30" to -- 30 thereof --

Column 5,
Line 2, before "54" delete "of"
Line 25, change "encapsulating" to -- encapsulation --
Line 53, change "portion" to -- portions --
Line 63, change "thereof 30" to -- 30 thereof --

Column 6,
Lines 6-7, change "retainer device" to -- device retainer --
Line 42, change "seiconductor" to -- semiconductor --
Line 62, delete "material"

Column 7,
Line 13, delete "material"
Line 24, change "thereof 30" to -- 30 thereof --
Line 28, at the end of the line, after "third" insert -- transition --
Line 34, change "retainer device" to -- device retainer --
Line 64, change "throught" to -- through --

UNITED STATES PATENT AND TRADEMARK OFFICE
CERTIFICATE OF CORRECTION

PATENT NO. : 6,414,378 B1
DATED : July 2, 2002
INVENTOR(S) : David J. Corisis and Brent Keeth It is certified that error appears in the above-identified patent and that said Letters Patent is hereby corrected as shown below:

Column 8,
Line 17, change "usinf" to -- using --
Line 22, delete "material"
Line 39, change "inlcudes" to -- includes --
Line 40, after "active" and before "thereof" insert -- surface --
Lines 48-49, change "insualtion" to -- insulation --
Lines 55 and 57, change "56" to -- 56º --
Lines 61 and 63, change "66" to -- 66º --
Line 65, change "56 and 66" to -- 56º and 66º --

Column 9,
Line 1, change "sdhesively" to -- adhesively --
Line 15, change "extends" to -- extend --
Line 36, change "thereform" to -- therefrom --
Line 42, change "retainer device" to -- device retainer --
Line 47, before "16" delete "material"

Column 10,
Lines 15 and 20, change "device retainer" to -- retainer device --
Line 19, after "as" change "known" to -- shown --
Line 67, before "16" delete "material"

Column 11,
Lines 16-17, change "seimconductor" to -- semiconductor --
Line 19, delete "material"

Column 12,
Lines 3 and 22, delete "material"
Line 12, after "side" insert -- 100 --

Column 13,
Lines 7, 9 and 30, change "20‴" to -- $20^v$ --
Line 20, change "falsh" to -- flash --
Line 24, change "coating" to -- tape --

Column 14,
Line 6, change "oads" to -- pads --
Line 22, change "aportion" to -- a portion --

UNITED STATES PATENT AND TRADEMARK OFFICE
CERTIFICATE OF CORRECTION

PATENT NO. : 6,414,378 B1
DATED : July 2, 2002
INVENTOR(S) : David J. Corisis and Brent Keeth It is certified that error appears in the above-identified patent and that said Letters Patent is hereby corrected as shown below:

Column 16,
Lines 24, 41, 59 and 61, change "retainer device" to -- device retainer --

Column 17,
Lines 20, 22, 44 and 46, change "retainer device" to -- device retainer --

Column 18,
Lines 7, 9, 34, 36, 58 and 60, change "retainer device" to -- device retainer --
Line 43, change "semicondutor" to -- semiconductor --
Line 46, after "attached" and before "the" insert -- to --
Line 63, change "theron" to -- thereon --

Signed and Sealed this

Third Day of February, 2004

JON W. DUDAS
*Acting Director of the United States Patent and Trademark Office*